United States Patent
Rabinovitch et al.

(10) Patent No.: US 10,140,413 B2
(45) Date of Patent: Nov. 27, 2018

(54) EFFICIENT RESOLUTION OF LATCH RACE CONDITIONS IN EMULATION

(71) Applicant: Synopsys, Inc., Mountain View, CA (US)

(72) Inventors: Alexander Rabinovitch, Shrewsbury, MA (US); Xavier Guerin, Wissous (FR)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/863,843

(22) Filed: Sep. 24, 2015

(65) Prior Publication Data

US 2016/0314239 A1    Oct. 27, 2016

Related U.S. Application Data

(60) Provisional application No. 62/150,615, filed on Apr. 21, 2015.

(51) Int. Cl.
*G06F 17/50* (2006.01)
*G01R 31/3185* (2006.01)
*G06F 11/25* (2006.01)

(52) U.S. Cl.
CPC ...... *G06F 17/5081* (2013.01); *G06F 17/5054* (2013.01); *G01R 31/318541* (2013.01); *G06F 11/25* (2013.01); *G06F 17/5022* (2013.01); *G06F 17/5027* (2013.01); *G06F 17/5045* (2013.01)

(58) Field of Classification Search
CPC ............ G06F 17/5027; G06F 17/5022; G06F 17/5054; G06F 17/5081; G06F 17/5045; G06F 11/25; G01R 31/318541
See application file for complete search history.

(56) References Cited

U.S. PATENT DOCUMENTS 5,649,176 A * 7/1997 Selvidge .................. G06F 1/04
                                                      713/400
5,886,904 A * 3/1999 Dai ..................... G06F 17/5045
                                                      703/14
6,158,022 A * 12/2000 Avidan ................ G06F 17/5031
                                                      714/26

(Continued)

OTHER PUBLICATIONS

LDCP_1 Xilinx datasheet excerpt p. 675.
LDCPE Xilinx datasheet excerpt p. 677.

*Primary Examiner* — Helen Rossoshek
(74) *Attorney, Agent, or Firm* — Alston & Bird LLP

(57) ABSTRACT

A computer-implemented method for configuring a hardware verification system is presented. The method includes receiving, in the computer, a first code representing a first design including a first latch configured to be evaluated in accordance with a first signal, when the computer is invoked to configure the verification system. The method further includes changing, using the computer, the first code into a second code representing a second design, the changing further including transforming, using the computer, the first latch into a second latch configured to be evaluated in accordance with a second signal different from the first signal after the first signal is received at the second latch, when the second code for the second design is compiled for programming into the hardware verification system.

42 Claims, 10 Drawing Sheets

(56) References Cited

U.S. PATENT DOCUMENTS

| | | | |
|---|---|---|---|
| 6,301,553 B1 * | 10/2001 | Burgun | G06F 17/5027 703/15 |
| 6,577,157 B1 * | 6/2003 | Cheung | H03K 19/1732 326/38 |
| 7,003,746 B2 * | 2/2006 | Hyduke | G06F 17/5027 703/13 |
| 7,051,294 B2 * | 5/2006 | Masleid | G06F 1/04 716/108 |
| 7,117,143 B2 * | 10/2006 | Wang | G06F 17/5027 703/13 |
| 7,231,615 B2 * | 6/2007 | Vandling | G01R 31/318307 716/103 |
| 7,453,759 B2 | 11/2008 | Ja et al. | |
| 7,512,728 B2 * | 3/2009 | Tseng | G06F 13/22 709/236 |
| 7,605,604 B1 * | 10/2009 | Young | H03K 19/1776 326/38 |
| 7,908,574 B2 * | 3/2011 | Larouche | G06F 17/5027 716/100 |
| 8,238,190 B2 * | 8/2012 | Ja | G06F 17/5022 365/189.04 |
| 8,274,306 B1 * | 9/2012 | Garcia | H03K 19/17768 326/47 |
| 8,448,148 B1 * | 5/2013 | Kolawa | G06F 11/3688 703/23 |
| 2009/0106608 A1 * | 4/2009 | Grise | G01R 31/318541 714/726 |
| 2010/0280814 A1 * | 11/2010 | Rabinovitch | G06F 17/5022 703/16 |
| 2014/0056054 A1 * | 2/2014 | Kim | G11C 13/0069 365/148 |
| 2016/0217235 A1 * | 7/2016 | Rabinovitch | G06F 17/5081 |
| 2016/0217236 A1 * | 7/2016 | Rabinovitch | G06F 17/5081 |

* cited by examiner

EFFICIENT RESOLUTION OF LATCH RACE CONDITIONS IN EMULATION

CROSS-REFERENCES TO RELATED APPLICATIONS

This application claims the benefit of priority under 35 U.S.C. § 119(e) to U.S. Provisional Application No. 62/150,615, filed Apr. 21, 2015, entitled "METHOD AND APPARATUS FOR EFFICIENT RESOLUTION OF LATCH RACE CONDITIONS IN EMULATION," the content of which is incorporated herein by reference in its entirety.

BACKGROUND

The present disclosure relates generally to testing a circuit design, and more particularly to testing such circuit using a programmable emulation or prototyping tool.

Integrated circuit (IC) designers commonly describe their designs in hardware description language (HDL) such as Verilog, VHDL, SystemC, and the like. In IC design, hardware emulation may refer to the process of replicating behavior of one or more pieces of hardware, hereinafter also referred to as a design under test (DUT), with another piece of hardware, such as a special-purpose emulation system. An emulation model is usually generated in accordance with a hardware description language source code representing the design under test. The emulation model is compiled into a format used to program the emulation system. Running the emulation system that has been programmed enables debugging and functional verification of the design under test. Overall progress of the emulation is usually controlled by a master clock signal generated on the emulator hardware.

In some scenarios, a race condition may happen in hardware emulation that may result in unwanted behavior of the design under test. Race condition refers to the behavior of the design under test, in which the output is dependent on the sequence or timing of other uncontrollable events. When the design under test is emulated on a programmable hardware, race conditions may happen as a result of assigning or mapping programmable modules, e.g., hardware primitives, such as latch primitives, to each component in the design under test.

Latch race conditions may be resolved by adding auxiliary storage elements to the design. In general, the number of auxiliary storage elements may be proportional to the number of latches in the design for which a race condition is being resolved. This usually leads to an increase in the area of the design, that is, additional hardware primitive resources in the emulator are used up. In general, an inherent race condition may occur in an emulator if no special measures are taken to prevent it.

accordingly, there is a need for techniques to identify and/or prevent race conditions in emulation without increasing the area of the design.

SUMMARY

According to one embodiment of the present invention, a computer-implemented method for configuring a hardware verification system is presented. The method includes receiving, in the computer, a first code representing a first design including a first latch configured to be evaluated in accordance with a first signal, when the computer is invoked to configure the verification system. The method further includes changing, using the computer, the first code into a second code representing a second design, the changing further including transforming, using the computer, the first latch into a second latch configured to be evaluated in accordance with a second signal different from the first signal after the first signal is received at the second latch, when the second code for the second design is compiled for programming into the hardware verification system.

According to one embodiment, the transforming further includes configuring, using the computer, the hardware verification system to disable evaluation of the second latch for a predetermined period of time using the second signal, and inject a new value of the first signal in the second design after the second latch is disabled. The transforming further includes configuring, using the computer, the hardware verification system to enable evaluation of the second latch in accordance with the first signal and the second signal after the expiration of the predetermined period.

According to one embodiment, to disable further includes receiving the predetermined period when the second code is compiled, using the computer. According to one embodiment, the predetermined period is associated with an estimated propagation of the first signal to the second latch in the hardware verification system.

According to one embodiment, the transforming further includes introducing, using the computer, in the second design a state machine configured to realize a number of cycles of a master clock of the hardware verification system within the predetermined period. According to one embodiment, the transforming further includes storing the number of cycles of the master clock in the state machine in the hardware verification system after running the hardware verification system.

According to one embodiment, the transforming further includes configuring, using the computer, the hardware verification system to inject the first signal into the second design after the second signal is received at the second latch. According to one embodiment, the first latch is one of a multitude of first latches represented in the first code and the second latch is one of a multitude of second latches represented in the second code. The transforming further includes transforming, using the computer, each one of the multitude of first latches into a different corresponding one of the multitude of second latches. The transforming further includes configuring, using the computer, each one of the multitude of second latches to be evaluated in accordance with the second signal after the first signal is received at each of the multitude of second latches.

According to one embodiment, the each one of the multitude of second latches is compiled, using the computer, so as to be programmed in the same programmable device. According to one embodiment, the evaluation of the second latch is in accordance with the logical AND operation of the first signal and the second signal.

According to one embodiment, the hardware verification system includes a programmable device and the second design is compiled, using the computer, in accordance with the programmable device. According to one embodiment, the programmable device is a field programmable gate array. According to one embodiment, the hardware verification system is an emulator system. According to one embodiment, the hardware verification system is a prototyping system. According to one embodiment, the second latch has the same number of one or more data inputs as the first latch.

According to one embodiment of the present invention, a system for configuring a hardware verification system is presented. The system is configured to receive a first code representing a first design including a first latch configured to be evaluated in accordance with a first signal, when the system is invoked to configure the verification system. The system is further configured to change the first code into a second code representing a second design. The change further configures the system to transform the first latch into a second latch configured to be evaluated in accordance with a second signal different from the first signal after the first signal is received at the second latch, when the second code for the second design is compiled for programming into the hardware verification system.

According to one embodiment, the system is further configured to disable evaluation of the second latch for a predetermined period of time using the second signal. The system is further configured to inject a new value of the first signal in the second design after the second latch is disabled, and enable evaluation of the second latch in accordance with the first signal and the second signal after the expiration of the predetermined period.

According to one embodiment, the system is further configured to receive the predetermined period when the second code is compiled. According to one embodiment, the system is further configured to introduce in the second design a state machine configured to realize a number of cycles of a master clock of the hardware verification system within the predetermined period. According to one embodiment, the system is further configured to store the number of cycles of the master clock in the state machine in the hardware verification system after running the hardware verification system. According to one embodiment, the system is further configured to inject the first signal into the second design after the second signal is received at the second latch.

According to one embodiment, the first latch is one of a multitude of first latches represented in the first code and the second latch is one of a multitude of second latches represented in the second code. The system is further configured to transform each one of the multitude of first latches into a different corresponding one of the multitude of second latches, and configure each one of the multitude of second latches to be evaluated in accordance with the second signal after the first signal is received at each of the multitude of second latches.

According to one embodiment, the system is further configured to compile each one of the multitude of second latches so as to be programmed in the same programmable device. According to one embodiment, the system is further configured to evaluate the second latch in accordance with the logical AND operation of the first signal and the second signal. According to one embodiment, the hardware verification system includes a programmable device and system is further configured to compile the second design in accordance with the programmable device.

According to one embodiment of the present invention, a non-transitory computer-readable storage medium includes instructions, which when executed by a computer, cause the computer to receive a first code representing a first design including a first latch configured to be evaluated in accordance with a first signal, when a hardware verification system is invoked to configure the verification system. The instructions further cause the computer to change the first code into a second code representing a second design. The change further causes the computer to transform the first latch into a second latch configured to be evaluated in accordance with a second signal different from the first signal after the first signal is received at the second latch, when the second code for the second design is compiled for programming into the hardware verification system.

According to one embodiment, the instructions further cause the computer to disable evaluation of the second latch for a predetermined period of time using the second signal. The instructions further cause the computer to configure the hardware verification system to inject a new value of the first signal in the second design after the second latch is disabled, and enable evaluation of the second latch in accordance with the first signal and the second signal after the expiration of the predetermined period.

According to one embodiment, the instructions further cause the computer to receive the predetermined period when the second code is compiled. According to one embodiment, the instructions further cause the computer to introduce in the second design a state machine configured to realize a number of cycles of a master clock of the hardware verification system within the predetermined period. According to one embodiment, the instructions further cause the computer to store the number of cycles of the master clock in the state machine in the hardware verification system after running the hardware verification system. According to one embodiment, the instructions further cause the computer to configure the hardware verification system to inject the first signal into the second design after the second signal is received at the second latch.

According to one embodiment, the first latch is one of a multitude of first latches represented in the first code and the second latch is one of a multitude of second latches represented in the second code. The instructions further cause the computer to transform each one of the multitude of first latches into a different corresponding one of the multitude of second latches. The instructions further cause the computer to configure each one of the multitude of second latches to be evaluated in accordance with the second signal after the first signal is received at each of the multitude of second latches.

According to one embodiment, the instructions further cause the computer to compile each one of the multitude of second latches so as to be programmed in the same programmable device. According to one embodiment, the instructions further cause the computer to configure the hardware verification system to evaluate the second latch in accordance with the logical AND operation of the first signal and the second signal. According to one embodiment, the hardware verification system includes a programmable device and the instructions further cause the computer to compile the second design in accordance with the programmable device.

A better understanding of the nature and advantages of the embodiments of the present invention may be gained with reference to the following detailed description and the accompanying drawings.

DETAILED DESCRIPTION

The term "programmable device" is used herein to refer to an integrated circuit designed to be configured and/or reconfigured after manufacturing. Programmable devices may include programmable processors, such as field programmable gate arrays (FPGAs) and/or any other type programmable devices. Configuration of the programmable device is generally specified using a computer code such as a hardware description language (HDL), such as for example Verilog, VHDL, or the like. A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks. In most FPGAs, logic blocks also include memory elements, which may be simple latches, flip-flops or more complex blocks of memory. Depending on the length of the interconnections between different logic blocks, signals may arrive at input terminals of the logic blocks at different times.

In some scenarios, race conditions may happen while verifying behavior of a design under test on a programmable device. The race condition may be caused as a result of mapping each hardware component in the design to the programmable logic blocks, such as latch primitives and the like, in the programmable device. The race condition may result in unwanted and/or uncontrollable behavior of the design under test during emulation. In one example, the race condition may happen because of differing propagation delays of signals before reaching input terminals of the programmable logic blocks.

One embodiment discloses techniques for reducing and/or eliminating race conditions in hardware emulation. The techniques described herein can be applicable for a specific family of logic blocks, e.g. design latches, that are within a given a programmable device. Similar paradigms may also be used across multiple programmable devices to reduce and/or eliminate race conditions.

Figure 1:
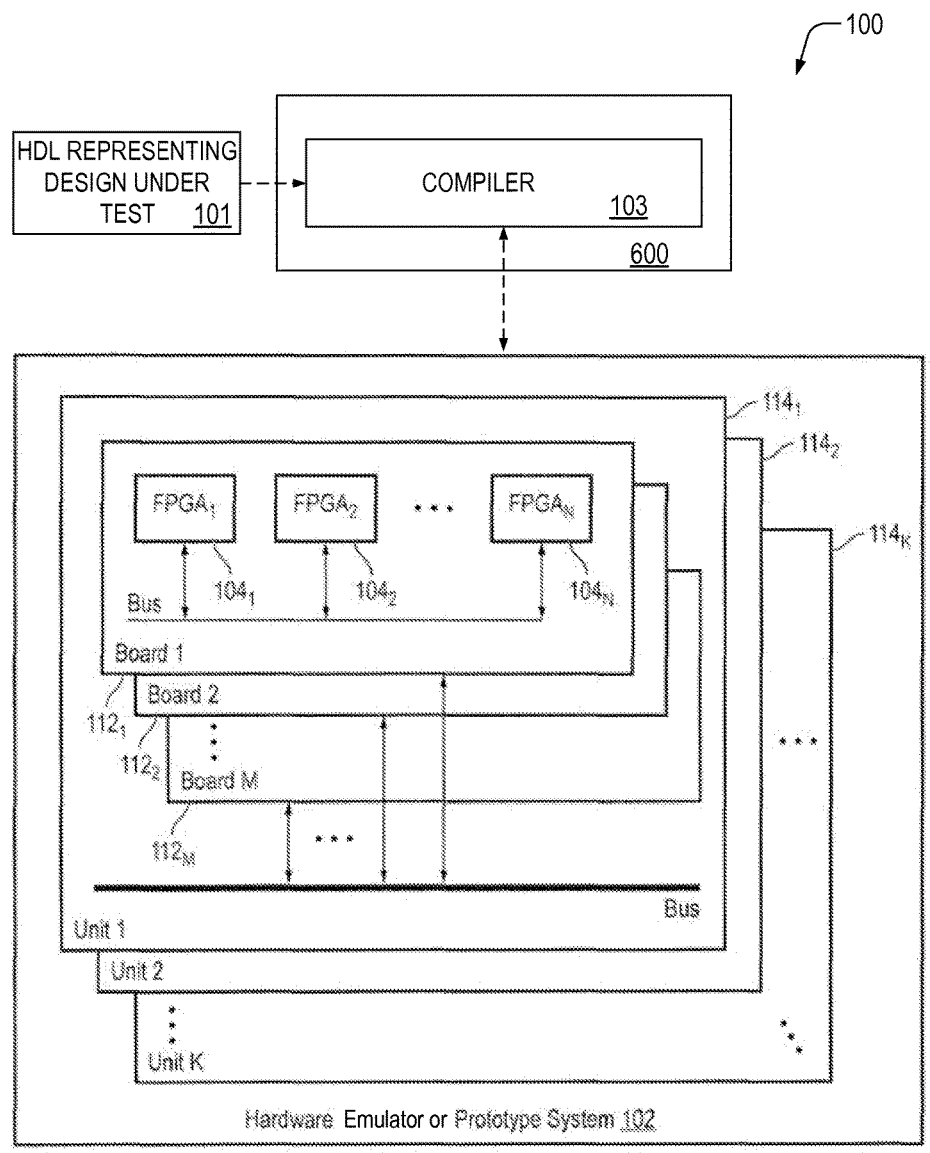
FIG. 1 depicts a simplified exemplary high level block diagram of a hardware verification system, in accordance with one embodiment of the present invention.

Hardware emulation and/or prototyping systems may utilize one or more programmable devices. FIG. 1 is an exemplary high-level block diagram of a hardware verification system 100, in accordance with one embodiment of the present invention. Hardware verification system 100 may be used to verify, test or debug a circuit design. Hardware verification system 100 may include a hardware emulation and/or prototype system 102 and a computer system 600 that is described in reference to FIG. 6. As depicted in FIG. 1, hardware emulation and/or prototype system 102 may be coupled to computer system 600, which may include a compiler 103 module that may receive a hardware description language code representing a design under test 101, hereinafter also referred to as "design under test," "circuit design," or "design."

Compiler 103 may include a multitude of various software modules that may or may not include a dedicated compiler module, however for the purposes of this description may be referred to as simply "compiler." Compiler 103 may transform, change, reconfigure, add new functions to, and/or control the timing of design under test 101 that facilitate verification, emulation, or prototyping of design 101. Further, compiler 103 may compile the code representing design under test 101 and any associated changes into a binary image used to program the hardware primitives disposed in hardware emulation and/or prototype system 102. Thereby, the logical functions and timing of design 101 that may ultimately be implemented by hardware in an integrated circuit chip may instead be first implemented in hardware emulation and/or prototype system 102. Among other advantages, verification of the design in hardware may be accomplished at much higher speed than by software verification alone.

Hardware emulation and/or prototype system 102 may include a multitude of programmable processors such as FPGAs $104_1$ through $104_N$, and other blocks (not shown), such as memories, input/output devices, other processors, and the like. The hardware emulation and/or prototype system receives a circuit design, and programs the programmable processors to verify behavior of the circuit design. Hardware emulation and/or prototype system 102 may include a primary or master system clock from which a number of other clock signals can be generated.

The programmable processors $104_1$-$104_N$ can be placed into one or more hardware boards $112_1$ through $112_M$. Multiple of such boards can be placed into a hardware unit, e.g. $114_1$. The boards within a unit may be connected using the backplane of the unit or any other types of connections. In addition, multiple hardware units (e.g., $114_1$ through $114_K$) can be connected to each other by cables or any other means to form a multi-unit system. In general, the hardware emulation or prototype system 102 may be made of a single board, a single unit with multiple boards, or multiple units without departing from the teachings of the present disclosure.

As described earlier, in order to verify functionality of the design under test on hardware emulation and/or prototype system 102, design latches in design under test 101 are often mapped onto latch primitives in one or more of the programmable devices, such as programmable processors $104_1$-$104_N$, in the hardware emulation and/or prototype system 102. New values of design clocks are usually injected on boundaries of each emulation cycle. Each emulation cycle may in-turn include many cycles of the system or master clock. These design clocks can be design primary clocks as well as derived clocks, or any other types of clocks that are ultimately connected to the latch primitives in the programmable device. Depending on a length of the interconnection that leads to each terminal of the latch primitives, updated signals may arrive at the input terminals of the latch primitives at different times. This may result in a race condition, if the timing of the signals is not properly accounted for. Race conditions may be described in accordance with the two example circuits as shown in FIG. 2A through FIG. 3.

Figure 2A:
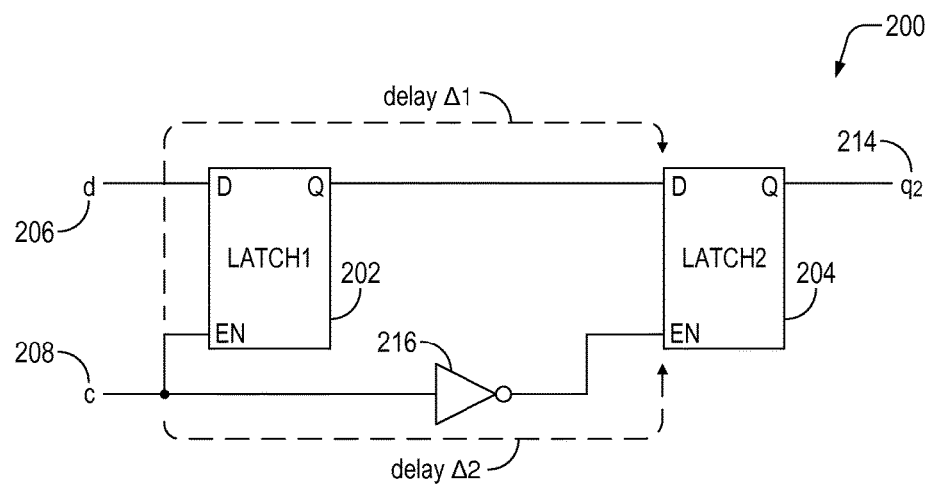
FIG. 2A depicts a simplified exemplary circuit schematic including two latches, in which race conditions may cause nondeterministic output, in accordance with one embodiment of the present invention.
Figure 3:
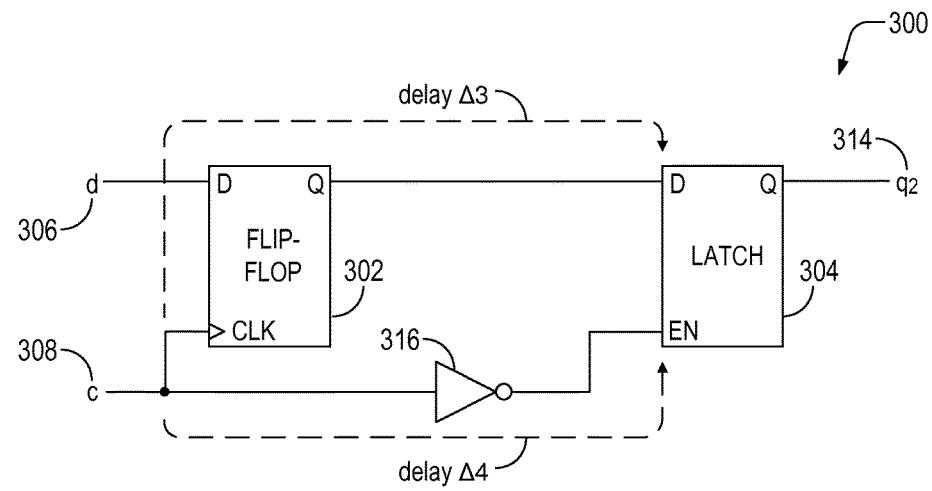
FIG. 3 depicts another simplified exemplary circuit schematic including a flip-flop and a latch, in which race conditions may cause nondeterministic output, in accordance with one embodiment of the present invention.

FIG. 2A depicts a simplified exemplary circuit schematic 200 including two latches, in which race conditions may result in nondeterministic output, in accordance with one embodiment of the present invention. Circuit schematic 200 includes a latch1 202, a latch2 204, and an inverter 216. Latch1 202 receives a data input signal d 206 at data input terminal D of latch1 202, hereinafter also referred to as "D latch 1," and a signal c 208 at enable input terminal EN of latch1 202, hereinafter also referred to as "EN latch 1." Signal c 208 may be a design clock signal used to control latch1 202 and latch2 204. An output terminal Q of latch1 202, hereinafter also referred to as "Q latch 1," may be connected to input data terminal D of latch2 204, hereinafter also referred to as "D latch 2". In another alternative example, Q latch1 may be coupled via other optional combinational logic (not shown) to D latch2. Further, signal c 208 passes through inverter 216 before reaching the enable input terminal EN of latch2 204, hereinafter also referred to as "EN latch 2." The output data is available on output terminal Q of latch2 204, hereinafter also referred to as "Q latch 2." In other words, a race condition may occur when the output of one latch is coupled to a data input of another latch and both latches are enabled on opposite polarities of the same signal, i.e. one latch is evaluated or transparent while the other latch is not-evaluated or non-transparent within the same half timing cycle as described in detail below.

Figure 2B:
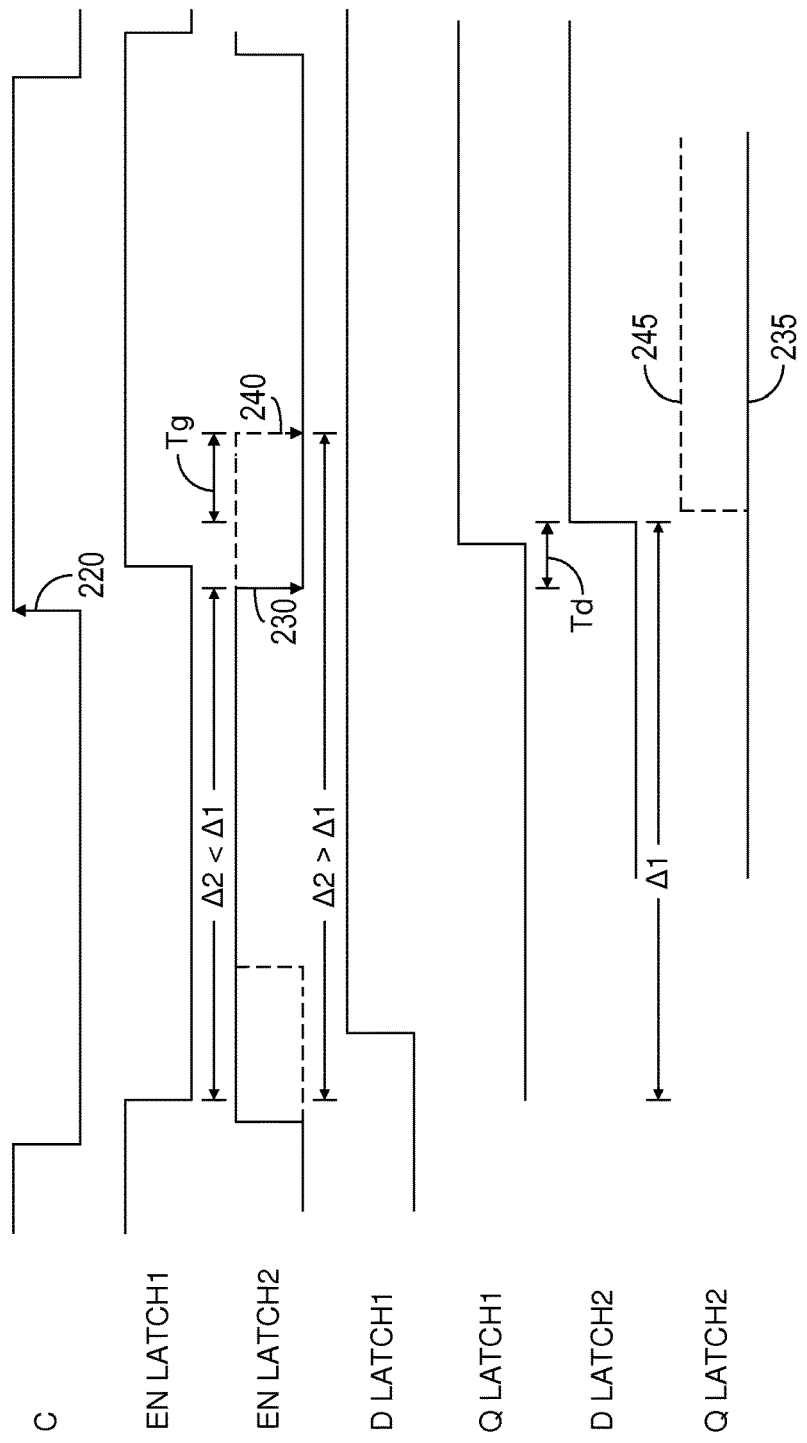
FIG. 2B depicts a simplified exemplary timing diagram of the example circuit schematic depicted in FIG. 2A, in accordance with one embodiment of the present invention.

FIG. 2B depicts a simplified exemplary timing diagram of the example circuit schematic 200 depicted in FIG. 2A, in accordance with one embodiment of the present invention. As depicted by a dashed line in FIG. 2A, a value change in signal d 206 reaches D latch2 after a delay $\Delta 1$. The initial conditions for the race timing condition are described as follows. Referring simultaneously to FIGS. 2A and 2B, delay $\Delta 1$ may be initiated by a previous transition on signal c 208 when latch1 202 receives, for example, a logic low signal on EN latch1 that causes latch1 202 to stop being evaluated or making latch1 202 non-transparent, i.e. Q latch1=previous value of D latch1 before the logic low signal reached EN latch1. The previous value of D latch1 is a logic low in this example. Q latch1 "latches" the low signal value so long as the EN latch1 remains low until the next transition. Delay $\Delta 1$ may be characterized in part by signal propagation delays due to the interconnect path implemented in the programmable device. In this example, it is assumed a new value of input signal d 206, i.e. a logic high value, reaches D latch 1 before the transition 220 of signal c 208 indicated by an upward arrow in FIG. 2B.

Further, as depicted by another dashed line marked as a delay $\Delta 2$ in FIG. 2A, a value change in signal c 208, reaches EN latch2 after delay $\Delta 2$, which is initiated at the same time and cause as delay $\Delta 1$. Delay $\Delta 2$ may be characterized in part by signal propagation delays due to the interconnect paths and the inverter 316 implemented in the programmable device. In one example, latch1 and latch2 may be defined in Verilog as follows:

```
always_latch begin : latch1
    if (c) q <= d;
end
always_latch begin : latch2
    if (~c) q2 <= q;
end
```

Still referring simultaneously to FIGS. 2A and 2B, there may be two possible nondeterministic outcomes at the circuit output, Q latch2, in accordance with the relationship between the lengths of delay $\Delta 1$ and delay $\Delta 2$. The two outcomes are determined in accordance with two possible race conditions; delay $\Delta 2$<delay $\Delta 1$ or delay $\Delta 2$>delay $\Delta 1$, which in turn are respectively characterized by whether the new clock transition propagates to the terminal of EN latch2 before or after the new data value propagates to the terminal of D latch2.

In one example, the current value or logic state of signal c 208 is zero and a new value, e.g. logic one, is injected into signal c 208 at transition 220 of signal c 208. The new value of c propagates to EN latch 1 and triggers evaluation of latch1, e.g. latch1 becomes transparent, and the value of q or Q latch1 is updated with the new value of D latch1, e.g. logic one, which in turn propagates to the terminal of D latch2 and thereby determining delay $\Delta 1$. When delay $\Delta 2$<delay $\Delta 1$, the inverse of signal c 208, e.g. a logic zero, propagates relatively quickly to the terminal of EN latch 2 at transition 230 indicated by a downward arrow, thereby disabling or causing latch2 204 to become non-transparent for a time period Td before the new value of data, e.g. logic one, propagates to terminal D latch2. Since latch2 204 is disabled or not evaluated before the new data arrives, the circuit output Q latch2 remains latched with the previous data, e.g. logic zero indicated by the solid line 235.

However, if $\Delta 2$>$\Delta 1$, which means that the inverse of signal c 208, e.g. signal ~c, passes through a longer propagation path inside the programmable device hardware than signal d 206 to reach latch2 204, the new value of signal ~c may not arrive at terminal EN latch2 before latch 2 204 is supposed to be disabled, set non-transparent, or not evaluated in the current timing cycle. As a result, the new value of signal ~c, e.g. a logic zero, propagates relatively slowly to the terminal of EN latch 2 at transition 240 indicated by a downward dashed arrow, thereby enabling or causing latch2 204 to remain transparent for a time period Tg after the new value of data, e.g. logic one, propagates to terminal D latch2. Since latch2 204 is enabled or still being evaluated after the new data arrives, the circuit output Q latch2 is updated with the new data, e.g. logic one indicated by the dashed line 245.

Accordingly, in the timing half cycle after transition 220, the race outcome $\Delta 2$>$\Delta 1$ causes latch 2 204 to be evaluated in the programmable device hardware emulation, which is not congruent with the Verilog semantic definition for the circuit design, which describes that latch 2 204 is not evaluated when latch 1 202 is evaluated. Accordingly, the circuit output at Q latch2 is nondeterministic with two possible outcomes in accordance with the race conditions instead of in accordance with the semantic circuit definition.

FIG. 3 depicts a simplified exemplary circuit schematic 300 including a flip-flop 302 and a latch 304, in which race conditions may cause nondeterministic output, according to one embodiment of the present invention. Circuit schematic 300 includes the same elements and functions as circuit schematic 200 depicted in FIG. 2A except a flip-flop 302 is substituted for latch 1 202. Delay Δ1 corresponds to delay Δ3 and delay Δ2 corresponds to delay Δ4. Similar race conditions and timing as shown in FIGS. 2A-2B, may also happen between the flip-flop 302 and latch 304, as shown in FIG. 3. In one example, latch 304 and flip flop 302 may be defined in Verilog as follows:

```
always @(posedge c) begin : flop1
    q <= d;
end
always_latch begin : latch2
    if (~c) q2 <= q;
end
```

In this example, when signal c 308 transitions from zero to one, the race condition similar to the situation in FIGS. 2A-2B may happen. Further, the same two race condition possibilities are symmetric with delay Δ4<delay Δ3 corresponding with delay Δ2<delay Δ1 and delay Δ4>delay Δ3 corresponding with delay Δ2>delay Δ1.

One embodiment provides a solution to resolve race conditions depicted in reference to FIGS. 2A-3, during emulation or prototyping of the circuit design on a programmable device, such as an FPGA, by changing the hardware description language code representing the design under test 101 into another code representing the design modified with additional transformations and state-machine logic that resolve the potential race conditions. In one embodiment, the following steps may be performed by compiler 103 to resolve race conditions during emulation:
a) Disable all latch evaluations for a group of latches inside the programmable device;
b) Inject the new values of clock c 208 into the design latches;
c) Wait long enough, i.e. for at least a predetermined period of time, until the new values of clocks or their inverses have reached respective latch terminals; and
d) Enable evaluation of latches and evaluate all the latches once on-demand after the predetermined period of time.

It should be noted that the group of latches, may in general, include any number of latches including latch2 204 and/or latch 304. In one example, the group of latches may include one or more latches. In another example, the group of latches may include all the latches in the design. The above approach ensures that transient and possibly inconsistent values of clocks controlling evaluation of the latches do not introduce nondeterministic effects on the evaluation of the latches. In addition, all latches that are transparent after the clock injection are evaluated using stable values of clocks.

In one embodiment, latch2 204 and/or latch 304 are transformed by compiler 103 to include two separate inputs, e.g. en1 and en2, that may derive a group of the latch primitives in an FPGA. En1 may correspond to the original en function in design 101, while en2 may be a new latch input used to disable evaluation of the transformed latch for a predetermined period of time and coupled to a new en_group signal to be described later. In this example, functional behavior of the latch can be described as follows (note that equivalent Verilog notations are used for illustration purposes only):

```
always @(en1 or en2 or d)
    if (en1 & en2) q <= d;
```

Notice that the function of the en2 input terminal and the en1 input terminal is completely symmetric, but FPGA vendors may distinguish between en1 and en2 input terminals by allowing only one of the two input terminals to be connected to a low-skew, i.e. faster than typical signal propagation speed, signal inside the FPGA. It is further noted that en2 and en1 may be respectively referred to as elk and en in some FPGA applications. In one embodiment, either of the two latch input terminals, en2 or en1, may be selected to represent the original enable input for latch2 204 and/or latch 304. In one embodiment, rather than introducing a new additional latch input to the design, such as en2, the original single en input to the latch may be used to receive the Boolean equivalent of en1 & en2, which may be implemented by any logic synthesized to perform the Boolean operation en1 AND en2 external to the latch primitive in the FPGA.

In one embodiment, in order to resolve race conditions in the FPGA, each latch, such as latch2 204 and/or latch 304, inside the group of latches within a given FPGA (group may cover some or all of the latches in the FPGA), that is defined as follows:

```
always @(c or d)
    if (c) q <= d;
``` where c and d may respectively correspond to signal c 208 and signal d 206, maybe transformed onto the following format:

```
always @(c or en_group or d)
    if (c & en_group) q <= d;
```

The above transformations by hardware verification system 100 during compilation of the design under test 101 allow the latches in the group of latches to be disabled and/or enabled in accordance with a common en_group signal. In one embodiment, the signal en_group is shared among all the latches within the group of latches. The transformation does not change the number of data input signals received by each of the latches and thereby conserves FPGA resources compared to known techniques that add additional input signals or ports to each latch.

Figure 4A:
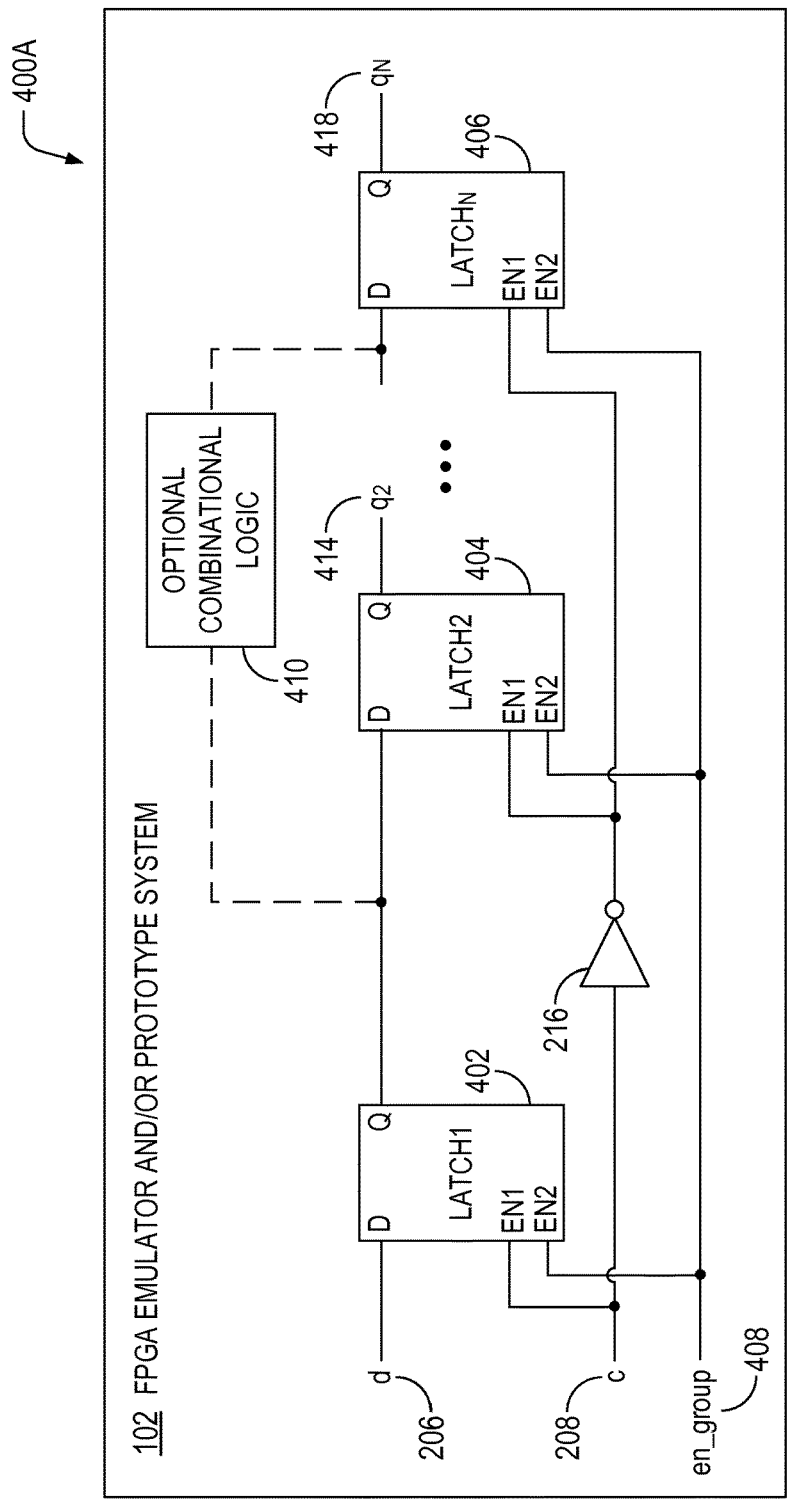
FIG. 4A depicts a simplified exemplary circuit schematic including multiple latches depicted in FIG. 2A in a group of latches that are transformed by the compiler to be connected to a common en_group signal to reduce race conditions, when the design is run in the FPGA emulator and/or prototype system, in accordance with one embodiment of the present invention.

FIG. 4A depicts a simplified exemplary circuit schematic 400A including multiple latches, e.g. latch1 202, latch2 204, depicted in FIG. 2A in a group of latches latch1 402-latch$_N$ 406 that are transformed by compiler 103 to be connected to a common en_group signal 408 to reduce race conditions, when the design is run in the FPGA emulator and/or prototype system 102, in accordance with one embodiment of the present invention. FIG. 4A includes similar elements and functions as referred to in FIG. 2 including each latch input EN corresponding in function to EN1 in FIG. 4A, with the following exceptions.

Latch1 202 and latch2 204 depicted in FIG. 2A have been transformed in FIG. 4A to latch1 402 and latch2 404 by compiler 103 to each include a new input enable terminal EN2, hereinafter also referred to as "EN2 latch$_N$," where N is an integer number greater than zero. Latch1 402-latch$_N$ 406 are connected to an en_group signal 408 that disables, i.e. not evaluates, and/or enables, i.e. evaluates, each of the latches in the group of latches on demand. It is noted that although EN1 and EN2 may have symmetric function within each FPGA latch hardware primitive, en_group signal 408 that is connected to each EN2 latch$_N$, is a separate enable signal that is different from signal c 208 that is coupled to each EN1 latch$_N$ as described below.

Still referring to FIG. 4A in one embodiment, Q latch1 may be coupled in parallel to D latch$_N$ via optional combinational logic 410 that may or may not be present in circuit schematic 200 and contribute a portion of delay Δ1 before being transformed into circuit schematic 400A. The output of Q latch2, Q latch$_N$ are connected to q$_2$ 414 and q$_N$ 418, respectively. In one embodiment, the transformation introducing EN2 latch1 may be eliminated since the control of latch1 402 by en_group may not be needed to obtain the desired elimination of potential latch race conditions, however transforming each latch in the group of latches may be simpler to implement. The following embodiment describes in greater detail operations using latch1 402-latch2 404 by way of an example, however it is understood that in the embodiment depicted in FIG. 4A each of the latches latch2 404-latch$_N$ 406 in the group of latches are operated similarly. The transformed latch1 402 and latch2 404 each have the same number of one or more data input signals, e.g. D latch1, D latch2, as do latch1 202 and latch2 204 in the original design under test 101 before transformation as depicted in FIG. 2A.

Figure 4B:
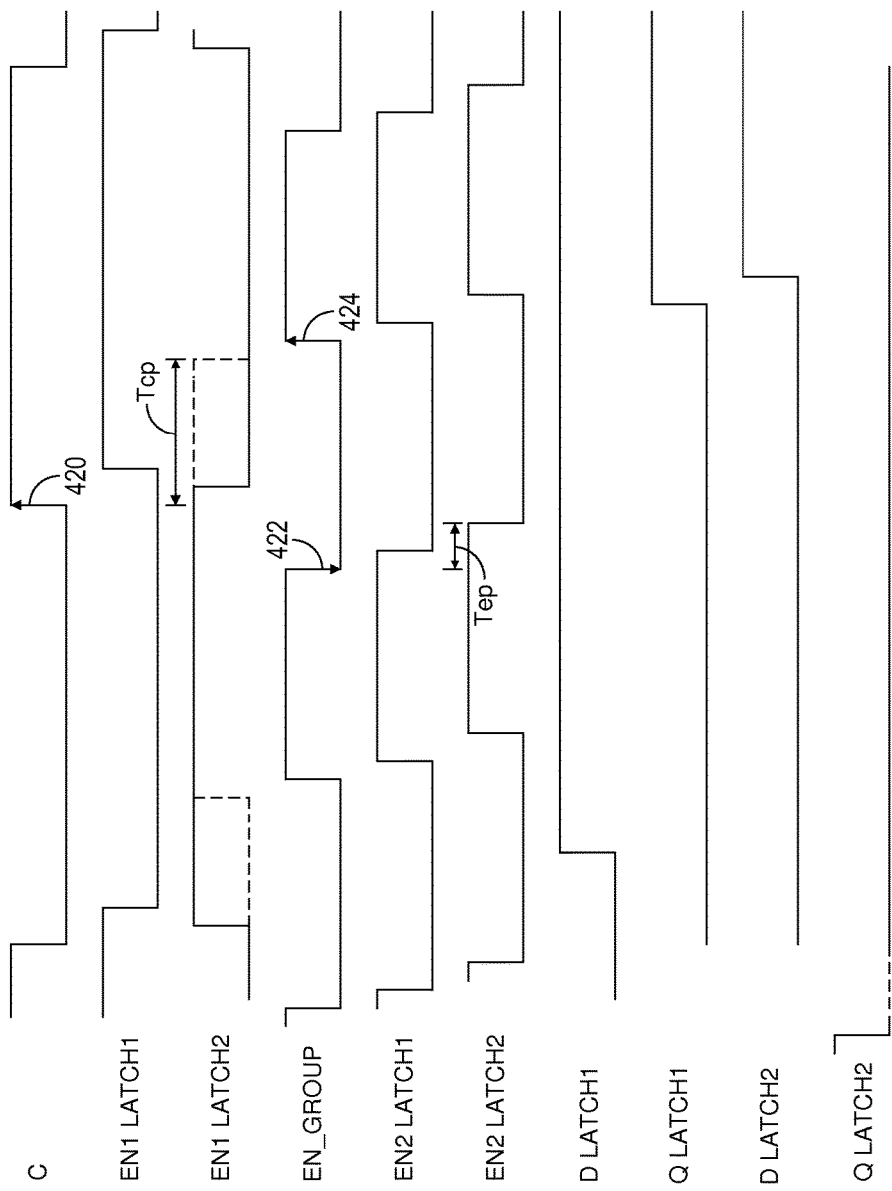
FIG. 4B depicts a simplified exemplary timing diagram of a portion of the circuit depicted in FIG. 4A, in accordance with one embodiment of the present invention.

FIG. 4B depicts a simplified exemplary timing diagram of a portion of the circuit depicted in FIG. 4A, in accordance with one embodiment of the present invention. Referring simultaneously to FIGS. 4A-4B, after transforming latch1 402-latch2 404 in the group of latches latch1 402-latch$_N$ 406, the injection of new clock values on signal c for latches inside the FPGA during each transition in the emulation clock cycle, such as a transition 420 depicted by an upward arrow, may be performed as follows.

Before signal c transition 420, assign en_group to a predefined logic state, e.g. zero, such as a transition 422 depicted by an downward arrow, to disable all latches in the group of latches, and wait for a time period Tep until the disabling operation has taken effect on or propagated to the corresponding EN2 terminal of every transformed latch within the group of latches. This time duration Tep for disabling the latches depends on FPGA architecture and the routing distance between the source of the enable signal and corresponding EN2 latch terminals. An implementation may or may not impose additional timing constraints on FPGA routing to reduce this time, such as in one embodiment, by using a low-skew interconnect option for the interconnect and EN2 terminal in the FPGA hardware primitive whereby the time period Tep may be reduced to a negligible time.

After time period Tep, inject new values of clocks for the latches, such as a transition 420 on signal c 208, and wait long enough, e.g. a predetermined period of time being clock propagation time period Tcp, for the final value of clocks and inverse clocks to arrive at all the transformed EN1 latch terminals. The time duration for clock propagation time period Tcp also depends on FPGA architecture and the routing distance between the clock signal source and corresponding latch terminals. one embodiment may or may not impose additional timing constraints on FPGA routing to reduce the clock propagation time period Tcp, for example by using low-skew signal paths in the FPGA.

After time period Tcp, assign en_group to another logic state, e.g. one, such as a transition 424 depicted by an upward arrow, to enable evaluation of all the latches within the group of interest.

FIG. 4B further depicts the same clock timing propagation instability at EN1 latch2 during time period Tcp as depicted on EN latch2 in FIG. 2B. However FIG. 4B depicts that because transition 424 occurs after time period Tcp, the logic low signal on en_group during clock stabilization time period Tcp prevents the evaluation of latch2 404 until all the clocks are stabilized. Given the same timing conditions for input D latch1 as depicted in FIG. 2B, Q latch 1 and D latch2 are delayed in FIG. 4B until after time period Tcp, and more significantly, Q latch2 maintains the desired low state required to be semantically congruent with the Verilog design under test 101 description because the transformation by compiler 103 has eliminated the latch race conditions described in reference to FIG. 2B.

Figure 4C:
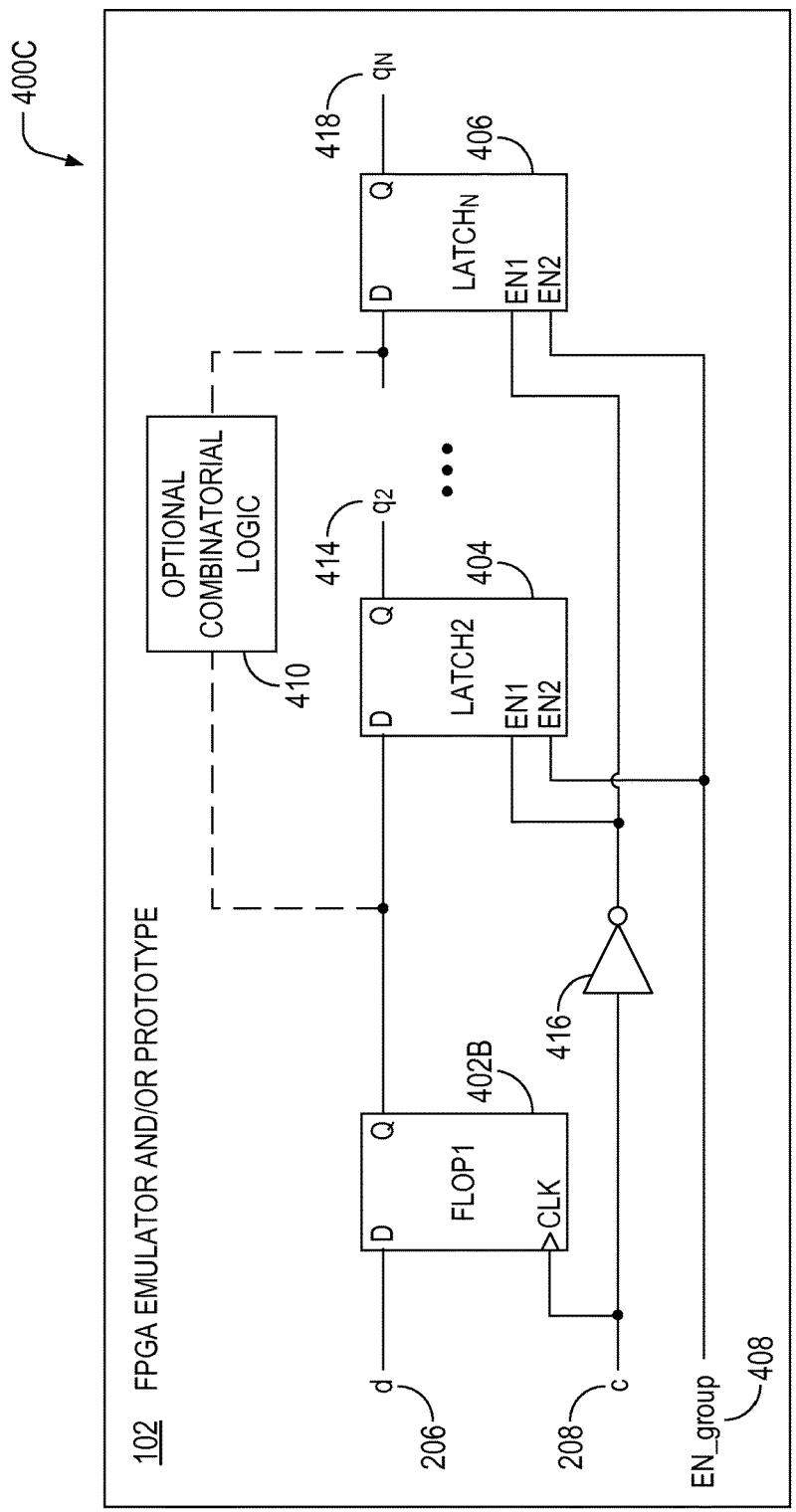
FIG. 4C depicts a simplified exemplary circuit schematic including the latch and flip flop depicted in FIG. 3 in a group of interest wherein the latch is transformed by the compiler to be connected to the common en_group signal, in accordance with one embodiment of the present invention.

FIG. 4C depicts a simplified exemplary circuit schematic 400C including flip-flop 302 and latch 304 depicted in FIG. 3 in a group of interest wherein latch 304 is transformed by compiler 103 to be connected to common en_group signal 408 to reduce race conditions, when the design is run in the FPGA emulator and/or prototype system 102, in accordance with one embodiment of the present invention. FIG. 4C depicts the same elements and functions as FIG. 4A except for the following. Latch1 402 is replaced by flip-flop 402B, which is not modified by any transformations. The function of circuit schematic 400C may be explained in reference to FIG. 4B analogously to circuit schematic 400A depicted in FIG. 4A.

Figure 4D:
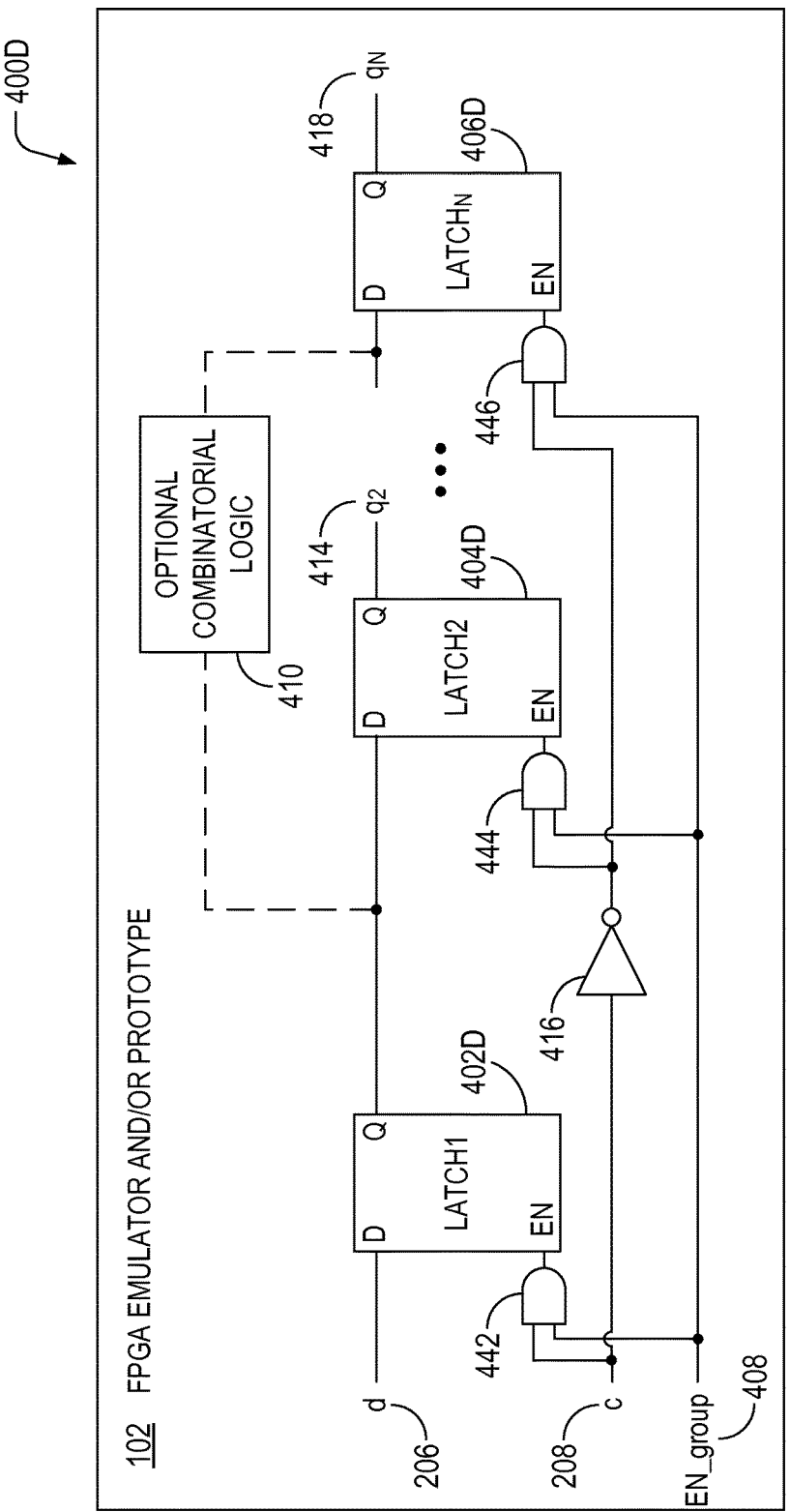
FIG. 4D depicts a simplified exemplary circuit schematic including the same elements and functionality as depicted in FIG. 4A except the multitude of latches is transformed so as to evaluate the multitude of latches in accordance with the logical AND operation of the signal c and the signal en_group, in accordance with one embodiment of the present invention.

FIG. 4D depicts a simplified exemplary circuit schematic 400D including the same elements and functionality as depicted in FIG. 4A except the multitude of latches is transformed so as to evaluate the multitude of latches in accordance with the logical AND operation of signal c 208 and signal en_group 408, in accordance with one embodiment of the present invention. In this example only one EN latch$_N$ signal may be available for each latch primitive. As discussed above, the Verilog syntax en1 & en2 may be implemented after circuit design change such that the transformation uses any FPGA logic primitives that implement the Boolean operation en1 AND en2 external to the FPGA primitive, without transforming the latch primitives internally. Accordingly, circuit schematic 400D includes AND gates 442, 444, 446 whose outputs are coupled respectively to EN latch1, EN latch2, EN latch$_N$. Each of the AND gates 442, 444, 446 include inputs coupled to signal c 208 and signal en_group 408.

Referring simultaneously to FIGS. 4A and 4D, it is understood that if both EN1 and EN2 are already in use before the transformation by compiler 103, e.g. signal c 208 may already be coupled to EN1 and a signal en (not shown) may be already coupled to EN2, then in one embodiment, the transformation may make similar use of AND gate 442 external to the latch primitive as described above. After transformation for example, the Boolean operation en_group 408 AND signal en may be derived external to the latch as a signal e (not shown) and coupled to EN2 instead of signal en. In this example, the transformation does not alter how signal c 208 is coupled to EN1. In verilog notation, each latch that is defined as follows:

```
always @(c or en or d)
    if (c & en) q <= d;
``` may be transformed onto the following format:

```
assign e = en_group & en;
always @(c or e or d)
    if (c & e) q <= d.
```

In an alternative embodiment, after transformation, the Boolean operation en_group 408 AND signal c 208 may be derived external to the latch as a signal e (not shown) and coupled to EN1 instead of signal c 208. In this alternative example, the transformation does not alter how signal en is coupled to EN2. It is further understood than many such alternative uses of boolean operations may be performed external to the latch primitive in accordance with the number of EN terminals available at a latch to accomplish controlling the evaluation of the latch in accordance with signal en_group 408

Figure 5A:
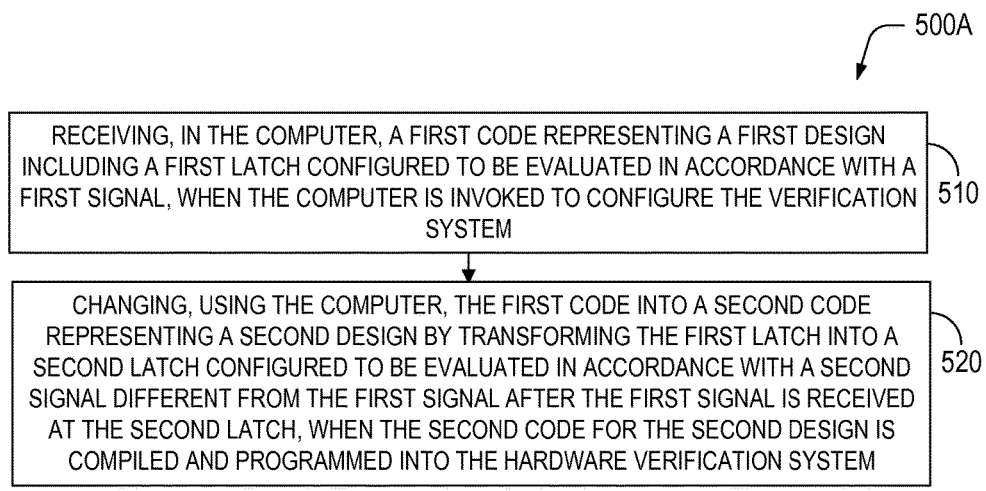
FIG. 5A depicts a simplified flow chart of the steps for configuring a hardware verification system to reduce or resolve race conditions during emulation of a design, in accordance with one embodiment of the present invention.

FIG. 5A depicts a simplified flow chart 500A of the steps for configuring a hardware verification system 100 to reduce or resolve race conditions during emulation of a design, in accordance with one embodiment of the present invention. Referring simultaneously to FIGS. 1, 2A, and 5A, flow chart 500A includes that computer system 600 receives 510 hardware description language code representing the design under test 101 including latch2 204 configured to be evaluated in accordance with a signal c 208 when computer system 600 is invoked to configure the verification system.

Then, referring simultaneously to FIGS. 2A, 4A, and 5A, flow chart 500A further includes that computer system 600 changes 520 hardware description language code representing the design under test 101 into another code representing the design modified with additional transformations and state-machine logic that resolve the potential race conditions. During the change 520, latch2 204 may be transformed into latch2 404 configured to be evaluated in accordance with en_group signal 408 different from signal c 208 after signal c 208 is received at input terminal EN1 latch2 of latch2 404, when the second code for the design modified with additional transformations and state-machine logic is compiled and programmed into hardware verification system 100.

Figure 5C:
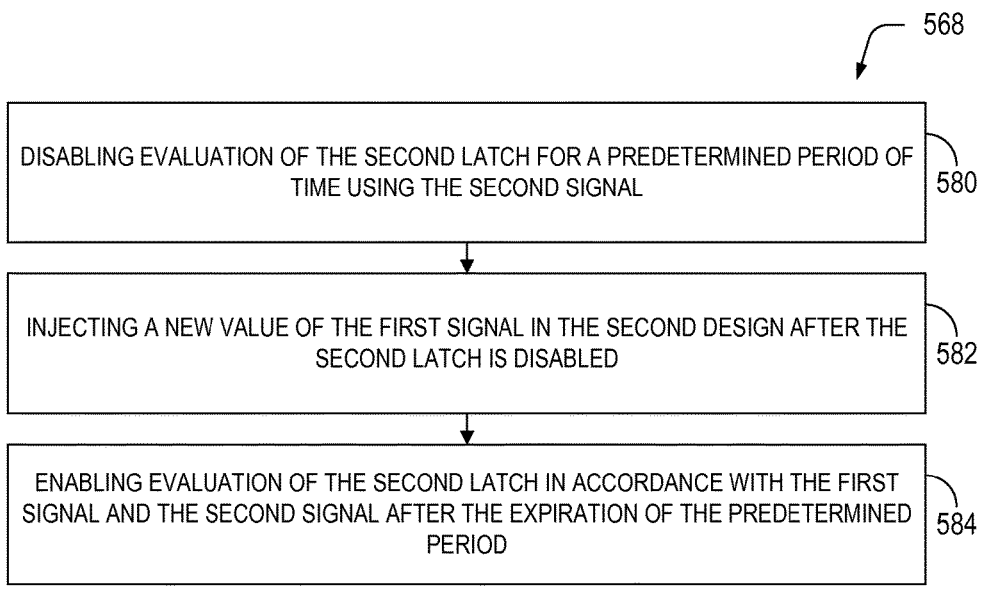
FIG. 5C depicts a simplified exemplary flowchart of the steps the hardware verification system is configured to do when the emulation is run in accordance with introducing an en_group register and associated state machine depicted in FIG. 5B, in accordance with one embodiment of the present invention.
Figure 5B:
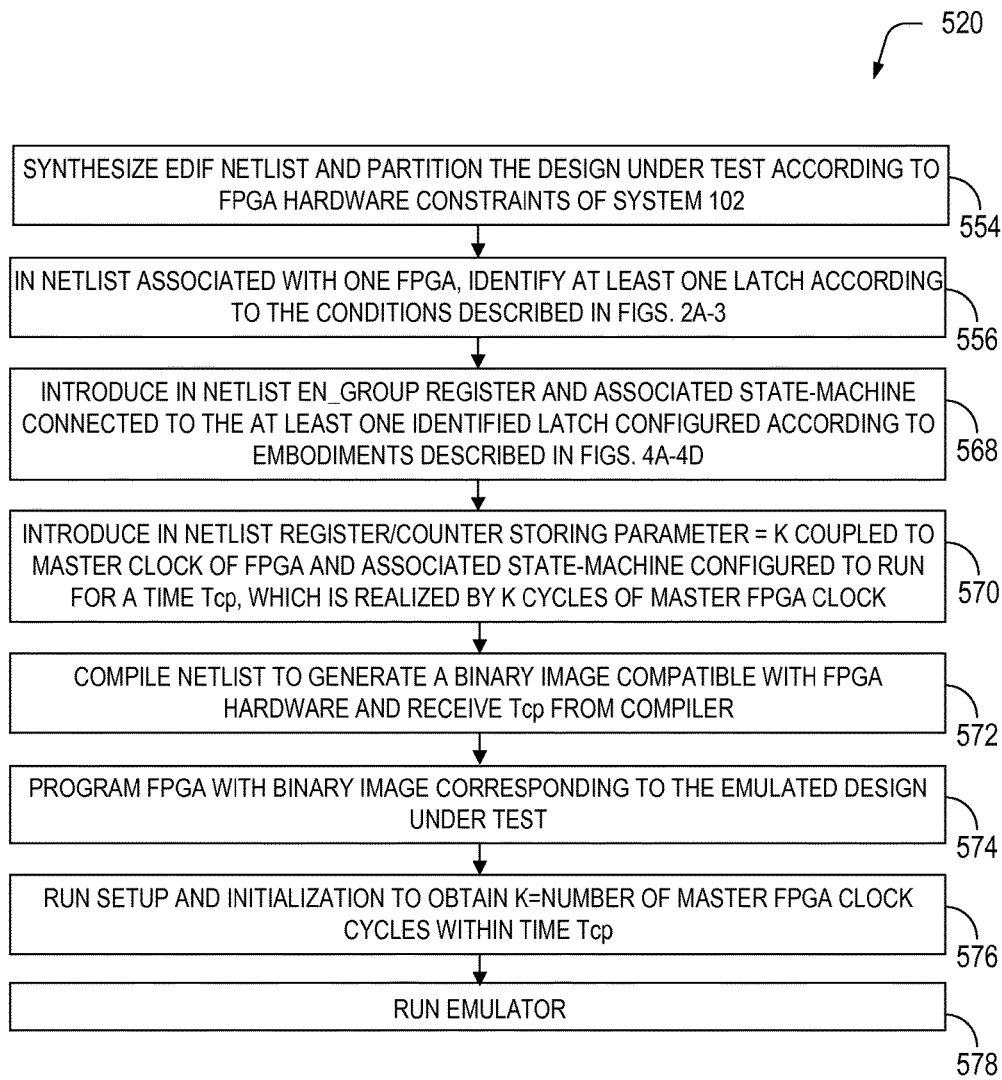
FIG. 5B depicts a simplified exemplary flowchart of the steps in changing the first code into the second code depicted in FIG. 5A, in accordance with one embodiment of the present invention.

FIG. 5B depicts a simplified exemplary flowchart of the steps 520 in changing the first code into the second code depicted in FIG. 5A, in accordance with one embodiment of the present invention. Referring simultaneously to FIGS. 1 and 5B, flow chart 520 includes that compiler 103 synthesizes 554 an electronic design interchange format (EDIF) netlist from the hardware description language code representing the design under test 101 and partitions design under test 101 according to FPGA hardware constraints of system 102. For example, portions of design under test 101 are allocated to be later programmed into $FPGA_1$ 104$_1$, $FPGA_2$ 104$_2$, through $FPGA_N$ 104$_N$ according to the hardware logic primitives and interconnect resources that are available in each FPGA.

Referring simultaneously to FIGS. 5B and 2A-3, flow chart 520 includes that compiler 103 then identifies 556 in the netlist associated with one FPGA, at least one latch, such as latch2 204 or latch 304 according to the conditions described in FIGS. 2A-3 that may lead to a latch race condition. In other words compiler 103 identifies the group of latches of interest to be transformed. In one embodiment, the group of latches, may in general, include any number of latches including latch2 204 and/or latch 304. In one example, the group of latches may include one or more latches. In another example, the group of latches may include all the latches in design 101 in the selected FPGA.

Referring simultaneously to FIGS. 5B and 4A-D, compiler 103 then introduces 568 in the netlist an en_group register and an associated state-machine connected to the at least one identified latch2 204 and/or latch 304 configured according to the embodiments described in FIGS. 4A-4D, thereby changing the design 101 and transforming the latches into latch2 404 and/or latch 404D. The introduced state machine is responsible for controlling the timing of signal c 208 and en_group signal 408. Among other functions, the introduced state machine needs to determine and store the predetermined clock propagation time period Tcp.

Compiler 103 introduces 570 in the associated introduced state-machine in the modified netlist a register/counter storing a parameter that is called K. The register/counter is coupled to a master clock of the selected FPGA. The associated introduced state-machine is configured to run for a time including time period Tcp, which is realized by K cycles of the master clock of the FPGA, when the hardware emulator or prototype system 102 is run for setup and initialization. The master clock of the FPGA may run at a higher frequency than signals associated with the design under test 101, such as signal c 208 or en_group signal 408.

Compiler 103 then compiles 572 the modified netlist to generate a binary image that is compatible with the FPGA hardware. In other words, the binary image code is capable of being programmed into the FPGA hardware. Further, the compiler receives time period Tcp during compilation in accordance with FPGA hardware constraints known by the FPGA manufacturer and made available to the compiler during the compilation step. Next, the FPGA is programmed 574 with the binary image corresponding to the design under test that is modified or changed for emulation purposes and with latch race conditions resolved.

Next, compiler 103 runs 576 setup and initialization of hardware emulation and/or prototype system 102 to obtain K that is equal to the number of master FPGA clock cycles counted within the time period Tcp using the introduced register/counter, thereby translating TCP from an absolute physical time, e.g. 20 ns to a digital quantity expressed in terms of the K number of master clock cycles. The number K of master clock cycles is stored in the register/counter in the introduced state machine hardware and calibrated to the specific FPGA hardware. In one embodiment, the time period Tep, associated with the en_group signal as described above, may also be translated from an absolute physical time supplied by the compiler and stored as another number, L, of master clock cycles in a different associated register analogous to the way K is derived above. When a low-skew or very fast signal path is available in the FPGA for the signal en_group, then L may be significantly smaller than K or even zero, in which case the state machine may not need to include separate associated logic and an associated register to derive and store L. The emulator may now be run 578 without latch race conditions.

As discussed above, compiler 103 changes and/or transforms the EDIF netlist code representing the design under test 101 by introducing the en_group register, the register/counter for parameter K, and associated state machine for controlling signal c 208 and en_group signal 408. The netlist is further changed by transforming latch2 204, latch 304 into latch2 404 and/or latch 404D respectively. FIG. 5C depicts a simplified exemplary flowchart of the steps the hardware verification system is configured to do when the emulation is run in accordance with introducing 568 an en_group register and associated state machine depicted in FIG. 5B, in accordance with one embodiment of the present invention. The computer makes the changes and/or transformations in the netlist using software and then programs the changed and/or transformed netlist into hardware in the FPGA that runs in accordance with the timing diagram depicted in FIG. 4B.

Referring simultaneously to FIGS. 5C, 2A, 2C, and 4A-D, the state machine, introduced using the computer by compiler 103, is configured to cause the hardware verification system to disable 580 evaluation of latch2 404 and/or latch 404D for a predetermined period of time Tcp using en_group signal 408, when the hardware verification system is run. Disable 580 occurs before injection of transition 420 of signal c 208. The introduced state machine in the hardware verification system causes en_group signal 408 to be in a first logic state, e.g. zero, from transition 422 through transition 424, which includes the time period Tcp to disable latch2 404 and/or latch 404D.

After transition 422 propagates to each of the terminals EN1 during time period Tep, the state machine is configured, using the computer, to cause the hardware verification system to inject 582 a new value of the signal c 208 in the design, which is modified by the introduced registers and state machine, after latch2 404 and/or latch 404D is disabled, when the hardware verification system is run. For example, the new value of the signal c 208 may be injected or applied at transition 420. The state machine is further configured, using the computer, to then cause the hardware verification system to enable 584 evaluation of latch2 404 and/or latch 404D, i.e. cause latch2 404 and/or latch 404D to become transparent, in accordance with signal c 208 and en_group signal 408 after the expiration of the predetermined period of time Tcp when the hardware verification system is run. For example, after the expiration of the predefined period of time Tcp, the hardware verification system causes the en_group signal 408 to be in a second logic state at transition 424, e.g. one, to enable evaluation of latch2 404 and/or latch 404D.

Figure 6:
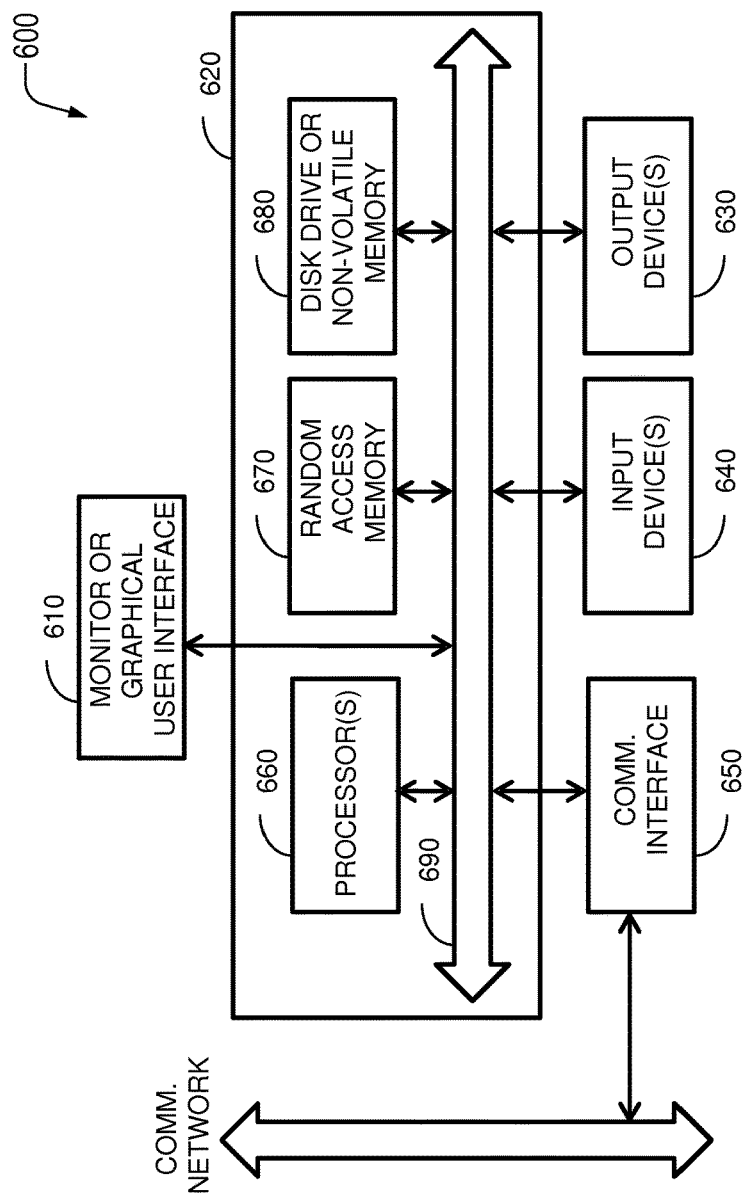
FIG. 6 is a block diagram of a computer system that may incorporate embodiments of the present invention.

FIG. 6 is a block diagram of a computer system that may implement the features, aspects, and steps of the methods discussed herein. FIG. 6 is merely illustrative of an embodiment incorporating the present invention and does not limit the scope of the invention as recited in the claims. One of ordinary skill in the art would recognize other variations, modifications, and alternatives. In one embodiment, computer system 600 typically includes a monitor 610, a computer 620, user output devices 630, user input devices 640, communications interface 650, and the like.

As shown in FIG. 6, computer 620 may include a processor(s) 660 that communicates with a number of peripheral devices via a bus subsystem 690. These peripheral devices may include user output devices 630, user input devices 640, communications interface 650, and a storage subsystem, such as random access memory (RAM) 670 and disk drive 680.

User input devices 630 include all possible types of devices and mechanisms for inputting information to computer system 620. These may include a keyboard, a keypad, a touch screen incorporated into the display, audio input devices such as voice recognition systems, microphones, and other types of input devices. In various embodiments, user input devices 630 are typically embodied as a computer mouse, a trackball, a track pad, a joystick, wireless remote, drawing tablet, voice command system, eye tracking system, and the like. User input devices 630 typically allow a user to select objects, icons, text and the like that appear on the monitor 610 via a command such as a click of a button or the like.

User output devices 640 include all possible types of devices and mechanisms for outputting information from computer 620. These may include a display (e.g., monitor 610), non-visual displays such as audio output devices, etc.

Communications interface 650 provides an interface to other communication networks and devices. Communications interface 650 may serve as an interface for receiving data from and transmitting data to other systems. Embodiments of communications interface 650 typically include an Ethernet card, a modem (telephone, satellite, cable, ISDN), (asynchronous) digital subscriber line (DSL) unit, FireWire interface, USB interface, and the like. For example, communications interface 650 may be coupled to a computer network, to a FireWire bus, or the like. In other embodiments, communications interfaces 650 may be physically integrated on the motherboard of computer 620, and may be a software program, such as soft DSL, or the like.

In various embodiments, computer system 600 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiment, computer 620 includes one or more Xeon microprocessors from Intel as processor(s) 660. Further, one embodiment, computer 620 includes a UNIX-based operating system.

RAM 670 and disk drive 680 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 670 and disk drive 680 may be configured to store the basic programming and data constructs that provide the functionality of the present invention.

The various steps of the methods described herein may be encoded in computer instructions, such as software code modules, stored in a non-transitory computer memory. A processor of a computer system may execute the instructions in order to cause the computer system to perform the method. Software code modules and instructions that provide the functionality of the present invention may be stored, for example, in RAM 670 and disk drive 680. These software modules may be executed by processor(s) 660. RAM 670 and disk drive 680 may also provide a repository for storing data used in accordance with the present invention.

RAM 670 and disk drive 680 may include a number of memories including a main random access memory (RAM) for storage of instructions and data during program execution and a read only memory (ROM) in which fixed non-transitory instructions are stored. RAM 670 and disk drive 680 may include a file storage subsystem providing persistent (non-volatile) storage for program and data files. RAM 670 and disk drive 680 may also include removable storage systems, such as removable flash memory.

Bus subsystem 690 provides a mechanism for letting the various components and subsystems of computer 620 communicate with each other as intended. Although bus subsystem 690 is shown schematically as a single bus, alternative embodiments of the bus subsystem may utilize multiple busses.

FIG. 6 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above embodiments of the present invention are illustrative and not limiting. Various alternatives and equivalents are possible. Although, the invention has been described with reference to one or two latches for transformation by way of an example, it is understood that the invention is not limited by the number of latches but may also be applicable to any number of latches in a programmable device. Although, the invention has been described with reference to one or two latch input terminals that enable evaluation of the latch by way of an example, it is understood that the invention is not limited by the number of latch input terminals that enable evaluation of the latch. The scope of the invention should, therefore, be determined not with reference to the above description, but instead should be determined with reference to the pending claims along with their full scope or equivalents.

What is claimed is:

1. A computer-implemented method for configuring a hardware verification system, the method comprising:
   receiving, in the computer, a first code representing a first circuit design including a first latch associated with a potential race condition, the first latch including:
      one or more data input signals; and
      a first output configured to be evaluated in accordance with a first signal, when the computer is invoked to configure the verification system; and
   changing, using the computer, the first code into a second code representing a second circuit design, the changing further including:
   transforming, using the computer, the first latch into a second latch without adding an additional data input signal, the second latch having:
      the same one or more data input signals as the first latch; and
      the first output configured to be evaluated in accordance with a second signal different from the first signal after the first signal is received at the second latch thereby to resolve the potential race condition, when the second code for the second design is compiled and programmed into the hardware verification system.

2. The computer-implemented method of claim 1, wherein the transforming further comprises configuring, using the computer, the hardware verification system to:
   disable evaluation of the second latch for a predetermined period of time using the second signal;
   inject a new value of the first signal in the second design after the second latch is disabled; and
   enable evaluation of the second latch in accordance with the first signal and the second signal after the expiration of the predetermined period.

3. The computer-implemented method of claim 2, wherein to disable further comprises receiving the predetermined period when the second code is compiled, using the computer.

4. The computer-implemented method of claim 2, wherein the predetermined period is associated with an estimated propagation of the first signal to the second latch in the hardware verification system.

5. The computer-implemented method of claim 2, wherein the transforming further comprises introducing, using the computer, in the second design a state machine configured to realize a number of cycles of a master clock of the hardware verification system within the predetermined period.

6. The computer-implemented method of claim 5, wherein the transforming further comprises storing the number of cycles of the master clock in the state machine in the hardware verification system after running the hardware verification system.

7. The computer-implemented method of claim 1, wherein the transforming further comprises configuring, using the computer, the hardware verification system to inject the first signal into the second design after the second signal is received at the second latch.

8. The computer-implemented method of claim 1, wherein the first latch is one of a plurality of first latches represented in the first code and the second latch is one of a plurality of second latches represented in the second code, wherein the transforming further comprises:
- transforming, using the computer, each one of the plurality of first latches into a different corresponding one of the plurality of second latches; and
- configuring, using the computer, each one of the plurality of second latches to be evaluated in accordance with the second signal after the first signal is received at each of the plurality of second latches.

9. The computer-implemented method of claim 8, wherein each one of the plurality of second latches is compiled, using the computer, so as to be programmed in the same programmable device.

10. The computer-implemented method of claim 1, wherein the evaluation of the second latch is in accordance with the logical AND operation of the first signal and the second signal.

11. The computer-implemented method of claim 1, wherein the hardware verification system includes a programmable device and the second design is compiled, using the computer, in accordance with the programmable device.

12. The computer-implemented method of claim 1, wherein the programmable device is a field programmable gate array.

13. The computer-implemented method of claim 1, wherein the hardware verification system is an emulator system.

14. The computer-implemented method of claim 1, wherein the hardware verification system is a prototyping system.

15. A system for configuring a hardware verification system, the system configured to:
- receive a first code representing a first circuit design including a first latch associated with a potential race condition, the first latch including:
  - one or more data input signals; and
  - a first output to be evaluated in accordance with a first signal, when the system is invoked to configure the verification system; and
- change the first code into a second code representing a second circuit design, the change further configures the system to:
  - transform the first latch into a second latch without adding an additional data input signal, the second latch having:
    - the same one or more data input signals as the first latch; and
    - the first output configured to be evaluated in accordance with a second signal different from the first signal after the first signal is received at the second latch thereby to resolve the potential race condition, when the second code for the second design is compiled and programmed into the hardware verification system.

16. The system of claim 15 further configured to:
- disable evaluation of the second latch for a predetermined period of time using the second signal;
- inject a new value of the first signal in the second design after the second latch is disabled; and
- enable evaluation of the second latch in accordance with the first signal and the second signal after the expiration of the predetermined period.

17. The system of claim 16 further configured to receive the predetermined period when the second code is compiled.

18. The system of claim 16, wherein the predetermined period is associated with an estimated propagation of the first signal to the second latch in the hardware verification system.

19. The system of claim 16 further configured to introduce in the second design a state machine configured to realize a number of cycles of a master clock of the hardware verification system within the predetermined period.

20. The system of claim 19 further configured to store the number of cycles of the master clock in the state machine in the hardware verification system after running the hardware verification system.

21. The system of claim 15 further configured to inject the first signal into the second design after the second signal is received at the second latch.

22. The system of claim 15, wherein the first latch is one of a plurality of first latches represented in the first code and the second latch is one of a plurality of second latches represented in the second code, the system further configured to:
- transform each one of the plurality of first latches into a different corresponding one of the plurality of second latches; and
- configure each one of the plurality of second latches to be evaluated in accordance with the second signal after the first signal is received at each of the plurality of second latches.

23. The system of claim 22 further configured to compile each one of the plurality of second latches so as to be programmed in the same programmable device.

24. The system of claim 15 further configured to evaluate the second latch in accordance with the logical AND operation of the first signal and the second signal.

25. The system of claim 15, wherein the hardware verification system includes a programmable device and system is further configured to compile the second design in accordance with the programmable device.

26. The system of claim 15, wherein the programmable device is a field programmable gate array.

27. The system of claim 15, wherein the hardware verification system is an emulator system.

28. The system of claim 15, wherein the hardware verification system is a prototyping system.

29. A hardware verification system comprising:
- a first module configured to receive a first circuit design including a first latch associated with a potential race condition, the first latch including:
  - one or more data input signals; and
  - a first output configured to be evaluated in accordance with a first signal, when the first module is invoked to receive the first circuit design; and
- a second module configured to change the first circuit design into a second circuit design thereby to transform the first latch into a second latch without adding an additional data input signal, the second latch including:
  - the same one or more data input signals as the first latch; and
  - the first output configured to be evaluated in accordance with a second signal different from the first signal after the first signal is received at the second latch thereby to resolve the potential race condition, when the hardware verification system is compiled and programmed with the second circuit design.

30. The system of claim 29, wherein the second module is further configured to:
- disable evaluation of the second latch for a predetermined period of time using the second signal;

inject a new value of the first signal in the second circuit design after the second latch is disabled; and enable evaluation of the second latch in accordance with the first signal and the second signal after the expiration of the predetermined period.

31. The system of claim 30, wherein the second circuit design is configured to receive the predetermined period when the second module changes the first circuit design into the second circuit design.

32. The system of claim 30, wherein the predetermined period is associated with an estimated propagation of the first signal to the second latch in the hardware verification system.

33. The system of claim 30, wherein the second module is further configured to introduce in the second circuit design a state machine configured to realize a number of cycles of a master clock of the hardware verification system within the predetermined period.

34. The system of claim 33, wherein the second circuit design is further configured to store the number of cycles of the master clock in the state machine in the hardware verification system after running the hardware verification system.

35. The system of claim 29, wherein the second circuit design is further configured to inject the first signal into the second circuit design after the second signal is received at the second latch.

36. The system of claim 29, wherein the first latch is one of a plurality of first latches in the first circuit design and the second latch is one of a plurality of second latches in the second circuit design, the system further configured to:

transform each one of the plurality of first latches into a different corresponding one of the plurality of second latches; and configure each one of the plurality of second latches to be evaluated in accordance with the second signal after the first signal is received at each of the plurality of second latches.

37. The system of claim 36, wherein the hardware verification system includes a programmable device, wherein the system is further configured to program each one of the plurality of second latches in the same programmable device.

38. The system of claim 29, wherein the second circuit design is further configured to evaluate the second latch in accordance with the logical AND operation of the first signal and the second signal.

39. The system of claim 29, wherein the hardware verification system includes a programmable device and the system is further configured to change the second circuit design in accordance with the programmable device.

40. The system of claim 29, wherein the hardware verification system includes a programmable device, wherein the programmable device is a field programmable gate array.

41. The system of claim 29, wherein the hardware verification system is an emulator system.

42. The system of claim 29, wherein the hardware verification system is a prototyping system.

* * * * *